(12) United States Patent
Eriguchi et al.

(10) Patent No.: US 11,047,800 B2
(45) Date of Patent: Jun. 29, 2021

(54) METHOD OF EVALUATING CARBON CONCENTRATION OF SILICON SAMPLE, METHOD OF EVALUATING SILICON WAFER MANUFACTURING PROCESS, METHOD OF MANUFACTURING SILICON WAFER, METHOD OF MANUFACTURING SILICON SINGLE CRYSTAL INGOT, SILICON SINGLE CRYSTAL INGOT AND SILICON WAFER

(71) Applicant: SUMCO CORPORATION, Tokyo (JP)

(72) Inventors: Kazutaka Eriguchi, Berkeley, CA (US); Shuichi Samata, Saga (JP); Syun Sasaki, Saga (JP)

(73) Assignee: SUMCO CORPORATION, Tokyo (JP)

(*) Notice: Subject to any disclaimer, the term of this patent is extended or adjusted under 35 U.S.C. 154(b) by 93 days.

(21) Appl. No.: 16/318,638

(22) PCT Filed: Jun. 14, 2017

(86) PCT No.: PCT/JP2017/021884
§ 371 (c)(1),
(2) Date: Jan. 17, 2019

(87) PCT Pub. No.: WO2018/016237
PCT Pub. Date: Jan. 25, 2018

(65) Prior Publication Data
US 2019/0162668 A1 May 30, 2019

(30) Foreign Application Priority Data
Jul. 19, 2016 (JP) .............................. JP2016-141088

(51) Int. Cl.
*G01N 21/64* (2006.01)
*G01N 21/95* (2006.01)
(Continued)

(52) U.S. Cl.
CPC ....... *G01N 21/6489* (2013.01); *G01N 21/274* (2013.01); *G01N 21/9501* (2013.01);
(Continued)

(58) Field of Classification Search
CPC ..... G01N 21/6489; H01L 22/00; H01L 22/10; H01L 22/12; H01L 22/14; H01L 22/20; H01L 22/30
(Continued)

(56) References Cited

U.S. PATENT DOCUMENTS 7,507,640 B2 * 3/2009 Kurita ................... H01L 21/268
                                                      257/E21.318
7,507,641 B2 * 3/2009 Morimoto ......... H01L 21/76254
                                                      257/E21.237
(Continued)

FOREIGN PATENT DOCUMENTS

| JP | 2005-019445 A | 1/2005 |
| JP | 2011-054691 A | 3/2011 |

(Continued)

OTHER PUBLICATIONS

An English translation of JP2015111615A by Patent Translate.*
(Continued)

*Primary Examiner* — Allen C. Ho
(74) *Attorney, Agent, or Firm* — Greenblum & Bernstein, P.L.C.

(57) ABSTRACT

Provided is a method of evaluating carbon concentration of a silicon sample, which includes: forming an oxide film on at least a part of a surface of an evaluation-target silicon sample; irradiating a particle beam onto a surface of the oxide film; irradiating excitation light having energy larger than a band gap of silicon onto the surface of the oxide film, onto which the particle beam has been irradiated; measuring intensity of photoluminescence emitted from the evaluation-
(Continued)

target silicon sample irradiated with the excitation and evaluating carbon concentration of the evaluation-target silicon sample on the basis of the measured intensity of photoluminescence, wherein the photoluminescence is band-edge luminescence of silicon.

13 Claims, 3 Drawing Sheets

(51) Int. Cl.
    *H01L 21/66*     (2006.01)
    *H01J 37/30*     (2006.01)
    *H01J 37/31*     (2006.01)
    *G01N 21/27*     (2006.01)

(52) U.S. Cl.
    CPC .......... *H01J 37/3002* (2013.01); *H01J 37/31* (2013.01); *H01L 22/00* (2013.01); *H01L 22/10* (2013.01); *H01L 22/14* (2013.01); *H01L 22/20* (2013.01); *H01L 22/30* (2013.01)

(58) Field of Classification Search
    USPC ...................................................... 250/459.1
    See application file for complete search history.

(56) References Cited

U.S. PATENT DOCUMENTS

| | | | |
|---|---|---|---|
| 7,700,394 B2 * | 4/2010 | Sadamitsu | C30B 29/06 438/45 |
| 7,727,783 B2 * | 6/2010 | Kubota | H01L 22/14 257/E21.531 |
| 7,731,801 B2 * | 6/2010 | Takemura | B08B 3/04 134/1.3 |
| 7,827,519 B2 * | 11/2010 | Scheffer | H01L 25/50 716/54 |
| 7,858,494 B2 * | 12/2010 | Endo | H01L 21/762 257/E21.088 |
| 7,915,055 B2 * | 3/2011 | Kurihara | H01L 22/20 438/14 |
| 7,915,145 B2 * | 3/2011 | Kurita | C30B 15/00 257/E21.318 |
| 8,063,466 B2 * | 11/2011 | Kurita | H01L 21/3221 257/463 |
| 8,101,508 B2 * | 1/2012 | Kurita | C30B 15/00 257/E21.091 |
| 8,411,263 B2 * | 4/2013 | Uchino | G01N 21/6456 356/237.2 |
| 8,864,907 B2 * | 10/2014 | Kurita | H01L 27/14689 117/11 |
| 9,117,676 B2 * | 8/2015 | Kadono | H01L 21/02381 |
| 9,541,452 B2 * | 1/2017 | Nakagawa | G01J 3/4406 |
| 9,660,141 B2 * | 5/2017 | Koike | H01L 21/0237 |
| 9,773,710 B2 * | 9/2017 | Kamada | H01L 22/14 |
| 10,330,599 B2 * | 6/2019 | Nakagawa | G01N 21/9501 |
| 10,641,708 B2 * | 5/2020 | Eriguchi | H01T 19/02 |
| 10,643,908 B2 * | 5/2020 | Mizusawa | G01N 21/66 |
| 2018/0038797 A1 | 2/2018 | Eriguchi et al. | |
| 2019/0064098 A1 | 2/2019 | Eriguchi et al. | |

FOREIGN PATENT DOCUMENTS

| | | |
|---|---|---|
| JP | 2013-152977 A | 8/2013 |
| JP | 2015-101529 A | 6/2015 |
| JP | 2015-111615 A | 6/2015 |
| JP | 2015-222801 A | 12/2015 |
| KR | 10-2012-0130050 A | 11/2012 |
| KR | 10-2014-0101716 A | 8/2014 |
| KR | 10-2014-0143683 A | 12/2014 |
| TW | 201545212 A | 12/2015 |

OTHER PUBLICATIONS

An English translation of JP2013152977A by Patent Translate.*
An English translation of JPH04344443A by Patent Translate.*
International Search Report issued in International Bureau of WIPO Patent Application No. PCT/JP2017/021884, dated Aug. 29, 2017.
International Preliminary Report on Patentability issued in International Bureau of WIPO Patent Application No. PCT/JP2017/021884, dated Jan. 22, 2019.
Office Action for KR App. No. 10-2019-7000119 dated Feb. 18, 2020 (w/ machine translation).
Taiwanese Office Action for Taiwanese Patent Application No. 106111862, dated Mar. 31, 2018; and English-language translation thereof.
Rejection Decision for Taiwanese Patent Application No. 106111862, dated Oct. 31, 2018; and English-language translation thereof.
Taiwanese Office Action for Taiwanese Patent Application No. 106111862, dated Mar. 27, 2019; and English-language translation thereof.
Office Action for KR App. No. 10-2019-7000119, dated Sep. 25, 2020 (w/ translation).

* cited by examiner

METHOD OF EVALUATING CARBON CONCENTRATION OF SILICON SAMPLE, METHOD OF EVALUATING SILICON WAFER MANUFACTURING PROCESS, METHOD OF MANUFACTURING SILICON WAFER, METHOD OF MANUFACTURING SILICON SINGLE CRYSTAL INGOT, SILICON SINGLE CRYSTAL INGOT AND SILICON WAFER

CROSS-REFERENCE TO RELATED APPLICATIONS

This application claims the benefit of priority to Japanese Patent Application No. 2016-141088 filed on Jul. 19, 2016, which is expressly incorporated herein by reference in its entirety.

TECHNICAL FIELD

The present invention relates to a method of evaluating carbon concentration of a silicon sample; a method of evaluating a silicon wafer manufacturing process; a method of manufacturing a silicon wafer; a method of manufacturing a silicon single crystal ingot; a silicon single crystal ingot; and a silicon wafer.

BACKGROUND ART

The reduction of impurity contamination causing deterioration of device properties is required for a silicon wafer to be used as a semiconductor substrate. In recent years, carbon has attracted attention as an impurity contained in a silicon wafer, and the reduction of carbon contamination in a silicon wafer has been examined. In order to reduce carbon contamination, it is desirable to evaluate carbon concentration of a silicon sample and to control, on the basis of the evaluation result, a manufacturing process of a silicon wafer and a manufacturing process of a silicon single crystal ingot from which a silicon wafer is cut out, so as to reduce carbon that might be mixed in the manufacturing processes.

Conventionally, as a method of evaluating carbon concentration of a silicon sample, a method of utilizing FT-IR (Fourier Transform Infrared Spectroscopy) (FT-IR method) has been generally used. Furthermore, a method of utilizing SIMS (Secondary Ion Mass Spectrometry) (SIMS method) or a method of utilizing photoluminescence (hereinafter, also described as "PL") (photoluminescence method) has also been proposed (for example, with respect to a photoluminescence method generally referred to as a "low temperature PL method," see Japanese Unexamined Patent Publication (KOKAI) Nos. 2013-152977 (patent literature 1), 2015-101529 (patent literature 2), and 2015-222801 (patent literature 3), which are expressly incorporated herein by reference in their entirety).

SUMMARY OF THE INVENTION

A detection lower limit of the FT-IR method described above is generally on the order of $10^{15}$ atoms/cm$^3$. In contrast, the SIMS method can perform higher sensitive analysis than the FT-IR method. On the other hand, a photoluminescence method described in the above publications can perform analysis with equal to or higher sensitivity than the SIMS method.

As described above, an evaluation result of carbon concentration of a silicon sample can be utilized for controlling manufacturing processes of a silicon wafer and silicon single crystal ingot. On the other hand, as a method of evaluating carbon concentration of a silicon sample, various methods have been conventionally proposed and used as described above. If a new method is provided which is capable of evaluating carbon concentration of a silicon sample, with high sensitivity equal to or higher than the sensitivity achievable by these conventional methods, the method is expected to contribute to providing a silicon wafer with a reduced carbon contamination.

An aspect of the present invention provides for a new method of evaluating carbon concentration of a silicon sample.

An aspect of the present invention relates to a method of evaluating carbon concentration of a silicon sample (hereinafter, also referred to as a "method of evaluating carbon concentration"), the method including:

forming an oxide film on at least a part of a surface of an evaluation-target silicon sample;

irradiating a particle beam onto a surface of the oxide film, irradiating excitation light having energy larger than a band gap of silicon onto the surface of the oxide film, onto which the particle beam has been irradiated;

measuring intensity of photoluminescence emitted from the evaluation-target silicon sample irradiated with the excitation light; and evaluating carbon concentration of the evaluation-target silicon sample on the basis of the measured intensity of photoluminescence, wherein the photoluminescence is band-edge luminescence of silicon.

In the above method of evaluating carbon concentration, carbon concentration of a silicon sample is evaluated by a photoluminescence method. By utilization of the photoluminescence method, it is possible to evaluate carbon concentration of a silicon sample with sensitivity higher than that of an FT-IR method, and with sensitivity equal to or higher than that of a SIMS method, both of the methods having been described above.

Incidentally, regarding a photoluminescence method, the patent literatures 1 to 3 propose to evaluate carbon concentration of a silicon sample by utilizing photoluminescence, However, each of the patent literatures 1 to 3 proposes to use luminescence intensity of a peak derived from impurities or defects as an indicator of carbon concentration (for example, see patent literature 1, claim 1; patent literature 2, claim 2; and patent literature 3, claim 1), and does not suggest at all that carbon concentration is evaluated on the basis of intensity of band-edge luminescence of silicon, unlike the case of the method of evaluating carbon concentration of a silicon sample of the present invention.

In an embodiment, the particle beam is an electron beam.

In an embodiment, resistivity of the evaluation-target silicon sample is equal to or higher than 1 Ω·cm.

In an embodiment, the intensity of photoluminescence is determined as intensity of band-edge luminescence at room temperature emitted from the evaluation-target silicon sample irradiated with the excitation light. Here, in the present invention and the description, "intensity of band-edge luminescence at room temperature" means intensity of band-edge luminescence to be measured under room temperature (for example, 20° C. to 30° C.), and preferably means band-edge luminescence to be measured by a room temperature PL method which will be described later in detail.

In an embodiment, the intensity of band-edge luminescence at room temperature is intensity of luminescence having a peak at a wavelength of 1150 nm.

In an embodiment, carbon concentration of the evaluation-target silicon sample is determined by using a calibration curve on the basis of the intensity of photoluminescence.

In an embodiment, the calibration curve is created by using: intensity of band-edge luminescence of silicon obtained by performing (1) to (4) below on each of a plurality of silicon samples for creating a calibration curve, each having a known carbon concentration; and the known carbon concentration.

(1) Forming an oxide film on at least a part of a surface of a silicon sample for creating a calibration curve, the sample having a known carbon concentration;

(2) Irradiating a particle beam onto a surface of the oxide film;

(3) Irradiating excitation light having an energy larger than a band gap of silicon onto the surface of the oxide film, onto which the particle beam has been irradiated; and (4) Measuring intensity of band-edge luminescence of silicon emitted from the silicon sample for creating a calibration curve and irradiated with the excitation light.

In an embodiment, the known carbon concentration is determined by a SIMS method.

In an embodiment, atmospheric temperature in an environment in which the evaluation-target silicon sample is placed during the period from the particle beam irradiation until the measurement of the photoluminescence intensity is equal to or lower than 100° C.

In an embodiment, the evaluation-target silicon sample is a silicon wafer.

A further aspect of the present invention relates to a method of evaluating a silicon wafer manufacturing process, the method including:

evaluating carbon concentration of a silicon wafer manufactured in an evaluation-target silicon wafer manufacturing process by the above method of evaluating carbon concentration; and evaluating a level of carbon contamination in the evaluation-target silicon wafer manufacturing process on the basis of the evaluation result.

A further aspect of the present invention relates to a method of manufacturing a silicon wafer, the method including:

evaluating a silicon wafer manufacturing process by the above evaluation method; and manufacturing a silicon wafer, either in a silicon wafer manufacturing process in which a level of carbon contamination has been determined, as a result of the evaluation, to be an allowable level, or in a silicon wafer manufacturing process after subjecting the silicon wafer manufacturing process in which a level of carbon contamination has been determined, as a result of the evaluation, to exceed an allowable level, to a carbon contamination reduction treatment.

A further aspect of the present invention relates to a silicon wafer manufactured by the above manufacturing method.

A further aspect of the present invention relates to a method of manufacturing a silicon single crystal ingot, the method including:

growing a silicon single crystal ingot by the Czochralski method;

evaluating carbon concentration of a silicon sample cut out from the silicon single crystal ingot by the above method of evaluating carbon concentration;

determining a silicon single crystal ingot manufacturing condition on the basis of the evaluation result; and growing a silicon single crystal ingot by the Czochralski method under the determined manufacturing condition.

"Manufacturing conditions" in the present invention and description include a pulling apparatus to be used, a grade of a raw material polysilicon, growing conditions (such as a pulling rate and a gas flow rate), and the like. Furthermore, even if the pulling apparatus itself is the same, a change of a pulling apparatus also includes cases where a design change of a member, an installation position change of a member or the like has been performed in the apparatus.

A further aspect of the present invention relates to a silicon single crystal ingot manufactured by the above manufacturing method.

A further aspect of the present invention relates to a silicon wafer cut out from the above silicon single crystal ingot.

According to an aspect of the present invention, it is possible to provide a new method of evaluating carbon concentration of a silicon sample by utilizing intensity of band-edge luminescence of silicon obtained by a photoluminescence method, which has not conventionally been known to serve as an indicator of carbon concentration of a silicon sample.

DESCRIPTION OF EMBODIMENTS

[Method of Evaluating Carbon Concentration of Silicon Sample]

The method of evaluating carbon concentration of a silicon sample of the present invention includes: forming an oxide film on at least a part of a surface of an evaluation-target silicon sample; irradiating a particle beam onto a surface of the oxide film; irradiating excitation light having an energy larger than a band gap of silicon onto the surface of the oxide film, onto which the particle beam has been irradiated; measuring intensity of photoluminescence emitted from the evaluation-target silicon sample irradiated with the excitation light; and evaluating carbon concentration of the evaluation-target silicon sample on the basis of the measured intensity of photoluminescence. Furthermore, the photoluminescence is band-edge luminescence of silicon.

Hereinafter, the method of evaluating carbon concentration will be explained in more detail. This description includes speculation of the present inventors. However, it is only speculation, and does not limit the present invention at all.

<Evaluation-Target Silicon Sample>

A silicon sample being an evaluation target of the above evaluation method is, for example, a silicon sample cut out from a silicon single crystal ingot. For example, a sample cut out in a wafer-like shape from a silicon single crystal ingot, or a part further cut out from the sample can be subjected to evaluation. In addition, evaluation-target silicon samples can be various silicon wafers (for example, a polished wafer and epitaxial wafer) each used as a semiconductor substrate. In addition, the silicon wafer can also be a silicon wafer subjected to various processing treatments (for example, polishing, etching, cleaning, and the like) usually performed to a silicon wafer. A silicon sample may be an n-type silicon or may be a p-type silicon. A photoluminescence method is a technique with an evaluation result having little resistivity dependency, and thus the method is applicable to silicon samples having various types of resistivity. This point is an advantageous point of a photoluminescence method to carrier lifetime measurement (measurement results tend to depend on resistivity) known as an evaluation method of a silicon sample. Resistivity of a silicon sample is preferably equal to or higher than 1 Ω·cm (for example, 1 Ω·cm to 10000 Ω·cm) from the perspective of performing evaluation with higher sensitivity. The resistivity of a silicon sample described here means, with respect to a silicon sample including parts each having a different resistivity such as an epitaxial wafer having an epitaxial layer on a silicon substrate, resistivity of a part positioned directly under an oxide film onto which a particle beam is to be irradiated. For example, in a case where carbon concentration of a silicon substrate of an epitaxial wafer is to be evaluated, the resistivity can be resistivity of the silicon substrate, and in a case where carbon concentration of an epitaxial layer is to be evaluated, the resistivity can be resistivity of the epitaxial layer.

<Formation of Oxide Film>

An oxide film is formed on at least a part of a surface of an evaluation-target silicon sample, before irradiation with a particle beam. Then, after the formation of an oxide film, a particle beam is irradiated onto the surface of the oxide film formed on the evaluation-target silicon sample. The present inventors consider that an oxide film formed on an evaluation-target silicon sample can function as a protective film that protects an evaluation-target silicon sample from the energy of a particle beam, and can function as a passivation (surface deactivation) film that suppresses surface recombination after irradiation with excitation light. The present inventors speculate that the formation of the oxide film contributes to detecting photoluminescence (band-edge luminescence of silicon), with high intensity and stability.

An oxide film may be formed on at least a part of a surface of an evaluation-target silicon sample. On an evaluation-target silicon sample, it is sufficient to form an oxide film on at least a portion onto which a particle beam is to be irradiated, and an oxide film may also be formed on a portion onto which a particle beam isn't to be irradiated. For example, in a case of a wafer-like shaped silicon sample, an oxide film may be formed on a part or the whole of one main surface of two main surfaces, or an oxide film may be formed on a part or the whole of each of both main surfaces.

A formation method of an oxide film is not particularly limited, and known formation methods of an oxide film such as dry oxidation or wet oxidation can be used. Dry oxidation is preferable from the perspective of thickness uniformity of an oxide film to be formed. However, as described above, a formation method of an oxide film is not particularly limited. Dry oxidation can be performed by various methods capable of forming an oxide film without using a treatment liquid, such as thermal oxidation and plasma treatment, and thermal oxidation is preferable. Thermal oxidation can be performed by arranging a silicon sample in a heated oxidizing atmosphere. Here, an oxidizing atmosphere means an atmosphere containing at least oxygen, for example, an atmosphere containing oxygen ranging from 10 vol % to 100 vol %. For example, atmospheric temperature (heating temperature) of an oxidizing atmosphere can be set to 700° C. to 1300° C., and heating time is set to 1 minutes to 1000 minutes. However, it is sufficient to form an oxide film on at least a part of an evaluation-target silicon sample, and heating temperature and heating time are not limited in the above ranges.

Thickness of an oxide film formed on an evaluation-target silicon sample can be set to, for example, approximately 2 nm to 1 μm, but is not particularly limited. A natural oxide film may exist on a surface of a silicon sample before formation of an oxide film. An oxide film may be formed after removing the natural oxide film, or an oxide film may be formed without the removal. A natural oxide film can be removed by a hydrofluoric acid (HF) treatment as described in, for example. Japanese Unexamined Patent Publication (KOKAI)

<Particle Beam Irradiation>

An evaluation-target silicon sample is irradiated with a particle beam after the formation of an oxide film. A surface, onto winch a particle beam is to be irradiated, is a surface of an oxide film formed on an evaluation-target silicon sample. Particles to be irradiated as a particle beam can be various particles that cause a particle beam such as electrons and ionized atoms (such as He and various dopants). The present inventors speculate that, as a result of irradiation with a particle beam, carbon contained in the silicon sample becomes electrically active and begins to function as a carrier trap. The present inventors consider that this causes an excellent correlation between intensity of band-edge luminescence of silicon measured with respect to an evaluation-target silicon sample and carbon concentration. A particle beam with which an evaluation-target silicon sample is irradiated after the formation of an oxide film is preferably an electron beam. An electron beam is a flow of electrons obtained by applying an acceleration voltage to electrons. Preferable electron beam irradiation conditions are an acceleration voltage ranging from 400 kV to 3000 kV and an electron beam irradiation amount ranging from 1E14 electrons/cm$^2$ to 1E17 electrons/cm$^2$, from the perspective that hand-edge luminescence of silicon with high intensity can be obtained by irradiation with electrons having been given high energy through acceleration by voltage.

Circumstances in which an evaluation-target silicon sample is placed during the period from particle beam irradiation until photoluminescence measurement are not limited. In some cases, a silicon sample is subjected to a heat treatment referred to as a recovery heat treatment for recovering crystallinity of silicon after having been subjected to a certain treatment such as light irradiation or ion implantation, but photoluminescence can be measured with respect to a silicon sample after irradiation with a particle beam, without performing such a heat treatment. Namely, a silicon sample after irradiation with a particle beam can be subjected to photoluminescence measurement without a heat treatment for recovering crystallinity. In view of the above, atmospheric temperature of circumstances in which an evaluation-target silicon sample is placed during the period from particle beam irradiation until photoluminescence measurement can be set to be, for example, equal to or lower than 100° C., and also room temperature (for example, approximately 20° C. to 30° C.).

<Excitation Light Irradiation>

Excitation light, which is irradiated for the photoluminescence measurement onto a surface of an oxide film on a silicon sample after irradiation with a particle beam, has an energy larger than a band gap of silicon. As a consequence of irradiation with excitation light having such an energy, band-edge luminescence of silicon can be obtained as photoluminescence from the silicon sample. The band gap of silicon is, for example, approximately 1.1 eV at room temperature (for example, approximately 20° C. to 30° C.). A wavelength of excitation light is not particularly limited. Generally, visible light is used as excitation light. It is sufficient for the excitation light irradiation to give a band-edge luminescence of silicon, and known conditions can be applied as conditions of excitation light irradiation.

<Intensity Measurement of Photoluminescence (Band-Edge Luminescence of Silicon)>

From an evaluation-target silicon sample irradiated with excitation light having an energy larger than a band gap of silicon, band-edge luminescence of silicon can be obtained as photoluminescence. In the method of evaluating carbon concentration of the present invention, carbon concentration of an evaluation-target silicon sample is determined on the basis of the intensity of band-edge luminescence of the silicon. In contrast, as previously described, methods for evaluating carbon concentration of a silicon sample, which are proposed in the patent literatures 1 to 3 and which utilize a photoluminescence method, do not use hand-edge luminescence of silicon as an indicator. Intensity of band-edge luminescence of silicon can preferably be determined as intensity of band-edge luminescence at room temperature. The intensity of band-edge luminescence at room temperature can usually be determined as luminescence intensity having a peak at a wavelength of 1150 nm. As a technique capable of detecting such luminescence intensity, a room temperature PL method, which will be described in detail later, is preferable. The intensity of band-edge luminescence of silicon can be determined on the basis of, for example, area integrated intensity of an luminescence spectrum. In addition, the band-edge luminescence of silicon may be detected, for example, from a part of the surface (irradiated surface) on an evaluation-target silicon sample onto which excitation light has been irradiated, or from the whole surface of the irradiated surface. Intensity of band-edge luminescence of silicon to be used for evaluating carbon concentration can be determined, for example, as an average of values each obtained at a plurality of in-plane positions of the irradiated surface.

By the way, a measurement method referred to as a low temperature PL method is known as a measurement method of photoluminescence (PL). The low temperature PL method is a photoluminescence measurement method including cooling (generally, cooling to a temperature equal to or lower than 100K) a silicon sample whose photoluminescence is to be detected, by using a measurement apparatus equipped with a cooling device or by performing a step of cooling a silicon sample whose photoluminescence is to be detected. An example of a cooling device is an apparatus of circulating a refrigerant (such as liquid helium) as described in the patent literature 1, paragraph 0029, and an example of a step of cooling a silicon sample is a step of immersing a silicon sample in an ultralow temperature liquid such as liquid helium as described in the patent literature 3, paragraph 0053. In contrast, a photoluminescence measurement method of detecting photoluminescence without such cooling is referred to as a room temperature PL method. Here, a "room temperature PL method" in the present invention and the description means a photoluminescence measurement method performed without subjecting an evaluation-target silicon sample to cooling with a cooling device equipped to the measurement apparatus or without subjecting an evaluation-target silicon sample to cooling by a cooling process during the period, at least, from irradiation with excitation light until detection of photoluminescence, and preferably means a photoluminescence measurement method performed under room temperature (for example, 20° C. to 30° C.). In photoluminescence measurement by a low temperature PL method, there is a case where a silicon sample in a wafer-like shape has to be cut out into a small piece (for example, a small piece of several centimeters square) due to restriction of a sample size in introduction into an device or process for cooling a silicon sample. In contrast, since the room temperature PL method is performed without the above cooling, the method can be performed without such restriction on a sample size. Therefore, a silicon sample in a wafer-like shape can be subjected to photoluminescence measurement, with its shape maintained. Furthermore, a room temperature PL method generally has a higher measurement speed than a low temperature PL method, and is preferable also from the perspective of shortening measurement time, intensity of photoluminescence (band-edge luminescence of silicon) can be determined, for example, as an average value of a plurality of intensity values obtained on a measurement-target surface of a silicon sample. On the other hand, according to a photoluminescence method, the intensity can also be determined at each portion in a plane on a measurement-target surface (mapping measurement). According to a mapping measurement, information on carbon concentration distribution in a plane can be obtained. For example, it is possible to estimate a cause of carbon contamination in a silicon sample on the basis of positional information of a portion having a locally high carbon concentration. As an example, in a case of, for example, evaluating carbon concentration of a silicon wafer, if a portion having a locally high carbon concentration has been detected on a part of a silicon wafer surface, it is possible to estimate that a member having been in contact with the portion in a manufacturing process of the silicon wafer is a cause of carbon contamination in the silicon wafer. Then, it becomes possible, by performing replacement, cleaning or the like of the member, to reduce carbon contamination concentration of a silicon wafer to be subsequently manufactured. A room temperature PL method is preferable also from the perspective that it generally has higher spatial resolution than a low temperature PL method and can perform detailed mapping measurement.

The present inventors speculate that the particle beam irradiation performed as a pretreatment of photoluminescence measurement electrically activates carbon contained in a silicon sample and causes the carbon to function as a carrier trap. Based on the speculation, it is considered that a correlation between intensity of band-edge luminescence and carbon concentration, of silicon to be measured, becomes a negative correlation. The reason is that carbon-related carrier traps are considered to reduce intensity of band-edge luminescence of silicon. Accordingly, in an embodiment, carbon concentration of an evaluation-target silicon sample can be evaluated on the basis of an evaluation standard in which higher intensity of band-edge luminescence of silicon to be measured leads to lower carbon concentration. An embodiment of carbon concentration evaluation in the present invention includes determination of carbon concentration as a specific numeral value. Furthermore, another embodiment of carbon concentration evaluation in the present invention includes relative evaluation of carbon concentration on the basis of a value of intensity of band-edge luminescence of silicon without depending on a specific numerical value of carbon concentration. Specific examples of evaluations of the latter embodiment include, for example, evaluating a relative level of each carbon concentration of a plurality of evaluation-target silicon samples on the basis of a level of intensity of band-edge luminescence of silicon obtained with respect to each silicon sample; evaluating an in-plane carbon concentration distribution on the basis of a level of intensity of band-edge luminescence of silicon measured at respective in-plane portions of the identical silicon sample, and the like. On the other hand, regarding the evaluation according to the former embodiment, the use of a calibration curve is preferable in order to highly accurately derive a correlation between the measured intensity of band-edge luminescence of silicon and carbon concentration. Hereinafter, specific embodiments using a calibration curve will be explained. However, the present invention is not limited to specific embodiments described below.

<Creation of Calibration Curve>

A calibration curve shows a correlation between intensity of band-edge luminescence of silicon having been measured with respect to an evaluation-target silicon sample and carbon concentration. Carbon concentration to be used for creating a calibration curve can be measured by a known analysis method such as a SIMS method or a FT-IR method. A relational formula for determining carbon concentration from measurement results determined by SIMS and/or FT-IR is known. Carbon concentration to be used for creating a calibration curve is preferably measured by a SIMS method capable of measuring carbon concentration with higher sensitivity.

As a silicon sample to be used for creating a calibration curve, various silicon samples previously exemplified above with respect to evaluation-target silicon samples can be used. From the perspective of further enhancing accuracy of carbon concentration evaluation, preferably, a silicon sample for creating a calibration curve is a silicon sample cut out from the same silicon sample as the evaluation-target silicon sample, or is a silicon sample subjected to the same manufacturing process as the evaluation-target silicon sample.

A plurality of silicon samples for creating a calibration curve each having a known carbon concentration, the carbon concentration having been determined by methods exemplified above, is prepared, and these silicon samples for creating a calibration curve are subjected to processes (1) to (4) below in the same way as the evaluation of carbon concentration of an evaluation-target silicon sample to thereby be able to give intensity of band-edge luminescence of silicon of each silicon sample for creating a calibration curve. Details of processes (1) to (4) are as previously described regarding intensity measurement of band-edge luminescence of silicon of an evaluation-target silicon sample.

(1) Forming an oxide film on at least a part of a surface of each silicon sample for creating a calibration curve;

(2) Irradiating a particle beam onto a surface of the oxide film;

(3) Irradiating excitation light having an energy larger than a band gap of silicon onto the surface of the oxide film, onto which the particle beam has been irradiated; and (4) Measuring intensity of band edge luminescence of silicon emitted from the silicon sample for creating a calibration curve and irradiated with the excitation light.

A calibration curve can be obtained by determining intensity of band-edge luminescence of silicon of each silicon sample for creating a calibration curve, and then by applying a known fitting process to a graph obtained through plotting known carbon concentration in each silicon sample for drawing a calibration curve and determined intensity of band-edge luminescence for creating a calibration curve. Through the use of the calibration curve thus obtained and intensity of band-edge luminescence of silicon obtained with respect to an evaluation-target silicon sample, carbon concentration of the evaluation-target silicon sample can be determined. Specifically, for example, carbon concentration can be determined by substituting the intensity of band-edge luminescence of silicon obtained with respect to the evaluation-target silicon sample into a linear or nonlinear function representing a calibration curve.

[Method of Evaluating Manufacturing Process of Silicon Wafer, Method of Manufacturing Silicon Wafer, and Silicon Wafer]

An aspect of the present invention relates to a method of evaluating a silicon wafer manufacturing process (hereinafter, also described as a "manufacturing process evaluation method"), the method including:

evaluating carbon concentration of a silicon wafer manufactured in an evaluation-target silicon wafer manufacturing process by the above method of evaluating carbon concentration; and evaluating a level of carbon contamination in the evaluation-target silicon wafer manufacturing process on the basis of the evaluation result.

Furthermore, an aspect of the present invention also provides a method of manufacturing a silicon wafer, the method including:

evaluating a silicon wafer manufacturing process by the above method of evaluating a manufacturing process; and manufacturing a silicon wafer, either in a silicon wafer manufacturing process in which a level of carbon contamination has been determined, as a result of the evaluation, to be an allowable level, or in a silicon wafer manufacturing process after subjecting the wafer manufacturing process in which a level of carbon contamination has been determined, as a result of the evaluation, to exceed an allowable level, to a carbon contamination reduction treatment; and also provides a silicon wafer manufactured by the above manufacturing method.

The evaluation-target silicon wafer manufacturing process in the method of evaluating a manufacturing process of the present invention is a part of or the whole process of manufacturing a product silicon wafer. A manufacturing process of a product silicon wafer generally includes: processes of cutting-out (slicing) of a wafer from a silicon single crystal ingot; surface treatments such as polishing and etching; cleaning; and post-processes (such as formation of an epitaxial layer) to be performed as necessary in accordance with an intended use of a wafer. Each of these processes and treatments is known.

In a silicon wafer manufacturing process, carbon contamination may be generated in a silicon wafer due to contact of a member to be used in the manufacturing process with the silicon wafer, and the like. By evaluating carbon concentration of a silicon wafer manufactured in an evaluation-target manufacturing process and grasping a level of carbon contamination, it is possible to comprehend a tendency of generating carbon contamination in a product silicon water caused by an evaluation-target silicon wafer manufacturing process. Namely, it is possible to determine that higher carbon concentration of a silicon wafer manufactured in an evaluation-target manufacturing process leads to a tendency of more easily generating carbon contamination in the evaluation-target manufacturing process. Therefore, for example, in a case where an allowable level of carbon concentration has been set in advance and carbon concentration determined with respect to a silicon wafer manufactured in an evaluation-target silicon wafer manufacturing process exceeds the allowable level, it is possible to determine that the evaluation-target manufacturing process has a high tendency of generating carbon contamination and cannot be used as a manufacturing process of a product silicon wafer. The evaluation-target silicon wafer manufacturing process determined in this way is preferably used for manufacturing a product silicon wafer after being subjected to a carbon contamination reduction treatment. Details of this point will be described later.

Carbon concentration of a silicon wafer manufactured in an evaluation-target silicon wafer manufacturing process is determined by the method of evaluating carbon concentration of the present invention. Details of the method of evaluating carbon concentration are as described above in detail. A silicon wafer to be subjected to carbon concentration evaluation is at least one silicon wafer manufactured in an evaluation-target silicon wafer manufacturing process, and may be equal to or more than two silicon wafers. In a case where carbon concentration of each of equal to or more than two silicon wafers has been determined, for example, an average value, the maximum value or the like of the determined carbon concentration can be used for evaluating an evaluation-target silicon wafer manufacturing process.

In an aspect of the method of manufacturing a silicon wafer of the present invention, a silicon wafer manufacturing process is evaluated by the above method of evaluating a manufacturing process, and a silicon wafer is manufactured in a silicon wafer manufacturing process determined, as a result of the evaluation, that a level of carbon contamination is an allowable level. Accordingly, it becomes possible to ship high-quality silicon wafers each having a low-level carbon contamination, as product wafers. Furthermore, in another aspect of the method of manufacturing a silicon wafer of the present invention, a silicon wafer manufacturing process is evaluated by the above method of evaluating a manufacturing process, and a silicon wafer manufacturing process in which, as a result of the evaluation, a level of carbon contamination is determined to exceed an allowable level, is subjected to a carbon contamination reduction treatment, and then, silicon wafers are manufactured in the silicon wafer manufacturing process. Consequently, since carbon contamination caused by a manufacturing process can be reduced, it becomes possible to ship high-quality silicon wafers each having a low-level carbon contamination, as product wafers. The allowable level can be suitably set in accordance with quality required for a product wafer. In addition, examples of carbon contamination reduction treatments can include replacement, cleaning or the like of a member included in a silicon wafer manufacturing process. As an example, in a case where a susceptor made of SiC is used as a susceptor being a member liar placing a silicon wafer in a silicon water manufacturing process, a contact portion with a susceptor may be contaminated with carbon due to deterioration of the susceptor repeatedly used. In such a case, for example, replacement of the susceptor makes it possible to reduce carbon contamination caused by the susceptor.

[Method of Manufacturing Silicon Single Crystal Ingot, Silicon Single Crystal Ingot, and Silicon Wafer]

An aspect of the present invention relates to a method of manufacturing a silicon single crystal ingot, the method including:

growing a silicon single crystal ingot by the Czochralski method;

measuring a carbon concentration of a silicon sample cut out from the silicon single crystal ingot by the above method of evaluating carbon concentration;

determining a silicon single crystal ingot manufacturing condition on the basis of the measurement result; and growing a silicon single crystal ingot by the Czochralski method under the determined manufacturing condition, Furthermore, according to an aspect of the present invention, a silicon single crystal ingot manufactured by the above manufacturing method; and a silicon wafer cut out from the above silicon single crystal ingot, are also provided.

In the method of manufacturing a silicon single crystal ingot of the present invention, a known technique related to the Czochralski method (CZ method) can be applied to the growth of the silicon single crystal ingot by the CZ method. Carbon may be mixed into the silicon single crystal ingot grown by the CZ method, due to carbon mixed into a raw material polysilicon, CO gas generated during the growth, and the like. In order to manufacture a silicon single crystal ingot in which the mixing of carbon is suppressed, it is preferable to evaluate a mixed carbon concentration with high accuracy to thereby determine the manufacturing condition on the basis of the evaluation result. For this reason, the method of evaluating carbon concentration of the present invention is suitable as a method of evaluating the mixed carbon concentration.

In relation to a silicon single crystal ingot, when a tip part in the pulling-up direction at the time of growth is referred to as a top part and the other end portion is referred to as a bottom part, the carbon concentration normally tends to become higher as closer to the bottom part (segregation). Consequently, even if the silicon sample cut out from the bottom part contains carbon at a concentration allowing high-accuracy evaluation by the FT-IR method, the carbon concentration of the silicon sample cut out from the top part is lower than the carbon concentration of the bottom part, and thus high-accuracy evaluation may be difficult or the evaluation itself may be difficult in the FT-IR method. However, in order to manufacture a silicon single crystal ingot in which a carbon concentration is controlled to a low level over the entire area from the top part to the bottom part, preferably, the carbon concentration on the top part with a lower carbon concentration is evaluated with high accuracy, and on the basis of the evaluation result, conditions for manufacturing the silicon single crystal ingot are determined so as to reduce the carbon concentration. The "top part" refers to an area from a seed portion of the single crystal to the straight body part, and the "bottom part" refers to an area from the straight body part of the silicon single crystal ingot to a part on which a crystal diameter is narrowed into a conical shape. In relation to the above points, the method of evaluating carbon concentration of the present invention is suitable as a method of quantitatively determining a trace amount of carbon in the silicon sample cut out from the top part because the method allows high-accuracy evaluation of the carbon concentration within a concentration range in which high-accuracy evaluation is difficult in the FT-IR method. A carbon concentration of the silicon sample cut out from the top part can be lower than $1.0E+16$ atoms/cm$^3$, and is preferably equal to or lower than $1.0E+15$ atoms/cm$^3$, as the carbon concentration determined by the above method of evaluating carbon concentration. In addition, a carbon concentration of the silicon sample cut out from the top can be, for example, within a range of $1.0E+14$ atoms/cm$^3$ to $1.0E+$ 15 atom/cm$^3$, or 1.0E+13 atoms/cm$^3$ to 1.0E+15 atoms/cm$^3$, as the carbon concentration determined by the method of evaluating carbon concentration of the present invention. "E+" represents an exponent as well known. For example, "1.0E+14" means "1.0×10$^{14}$" as well known. The same also applies to other expressions that use E+.

The silicon sample cut out from the silicon single crystal ingot grown by the CZ method may be a sample cut out from any part (bottom part, top part, or intermediate area therebetween) of the silicon single crystal ingot. Preferably, the sample is a silicon sample cut out from the top part which tends to contain carbon in a lower concentration. The silicon single crystal ingot is grown, as necessary, under manufacturing conditions determined by adoption of a means for reducing the carbon concentration on the basis of the carbon concentration of the silicon sample cut out from the top part, whereby manufacturing of a silicon single crystal ingot in which carbon contamination is reduced over the entire area from the top part to the bottom part becomes possible. As a means for reducing carbon contamination, for example, equal to or more than one of the following means can be adopted:

(1) Use of a high grade product of raw material polysilicon in which a smaller amount of carbon is mixed,
(2) Proper adjustment of a pulling rate and/or an argon (Ar) gas flow rate at the time of pulling the crystal in order to suppress dissolution of CO into a polysilicon melt, and
(3) Performing changes in a design, a mounting position of a carbon-made member included in the pulling apparatus, and the like.

The silicon single crystal ingot manufactured under the manufacturing condition determined in such a way can have a carbon concentration equal to or lower than 1.0E+15 atoms/cm$^3$, can also have a carbon concentration ranging from 1.0E+14 atoms/cm$^3$ to 1.0E+15 atoms/cm$^3$, or can also have a carbon concentration ranging from 1.0E+13 atoms/cm$^3$ to 1.0E+15 atoms/cm$^3$, as determined by the method of evaluating carbon concentration of the present invention over the entire area from the top part to the bottom part.

The silicon single crystal ingot obtained, by the above manufacturing method, for example, can have a carbon concentration equal to or lower than 1.0E+15 atoms/cm$^3$, can also have a carbon concentration ranging from 1.0E+14 atoms/cm$^3$ to 1.0E+15 atoms/cm$^3$, or can also have a carbon concentration ranging from 1.0E+13 atoms/cm$^3$ to 1.0E+15 atoms/cm$^3$, as determined by the method of evaluating carbon concentration of the present invention regarding the silicon sample cut out from this silicon single crystal ingot over the entire area from the top part to the bottom part.

A silicon wafer cut out from the above silicon single crystal ingot, for example, can have a carbon concentration equal to or lower than 1.0E+15 atoms/cm$^3$, can also have a carbon concentration ranging from 1.0E+14 atoms/cm$^3$ to 1.0E+15 atoms/cm$^3$, or can also have a carbon concentration ranging from 1.0E+13 atoms/cm to 1.0E+15 atoms/cm$^3$, as determined by the above method of evaluating carbon concentration of the present invention.

As a result, according to an aspect of the present invention, the silicon single crystal ingot and the silicon wafer with a low carbon concentration can be provided.

EXAMPLES

Hereinafter, the present invention will be further explained on the basis of Examples. However, the present invention is not limited to embodiments shown in Examples. Processes and treatments below were performed at room temperature (20° C. to 30° C.), unless otherwise noted in particular.

Example 1

1. Growth of Silicon Single Crystal Ingot by CZ Method

Figure 1:
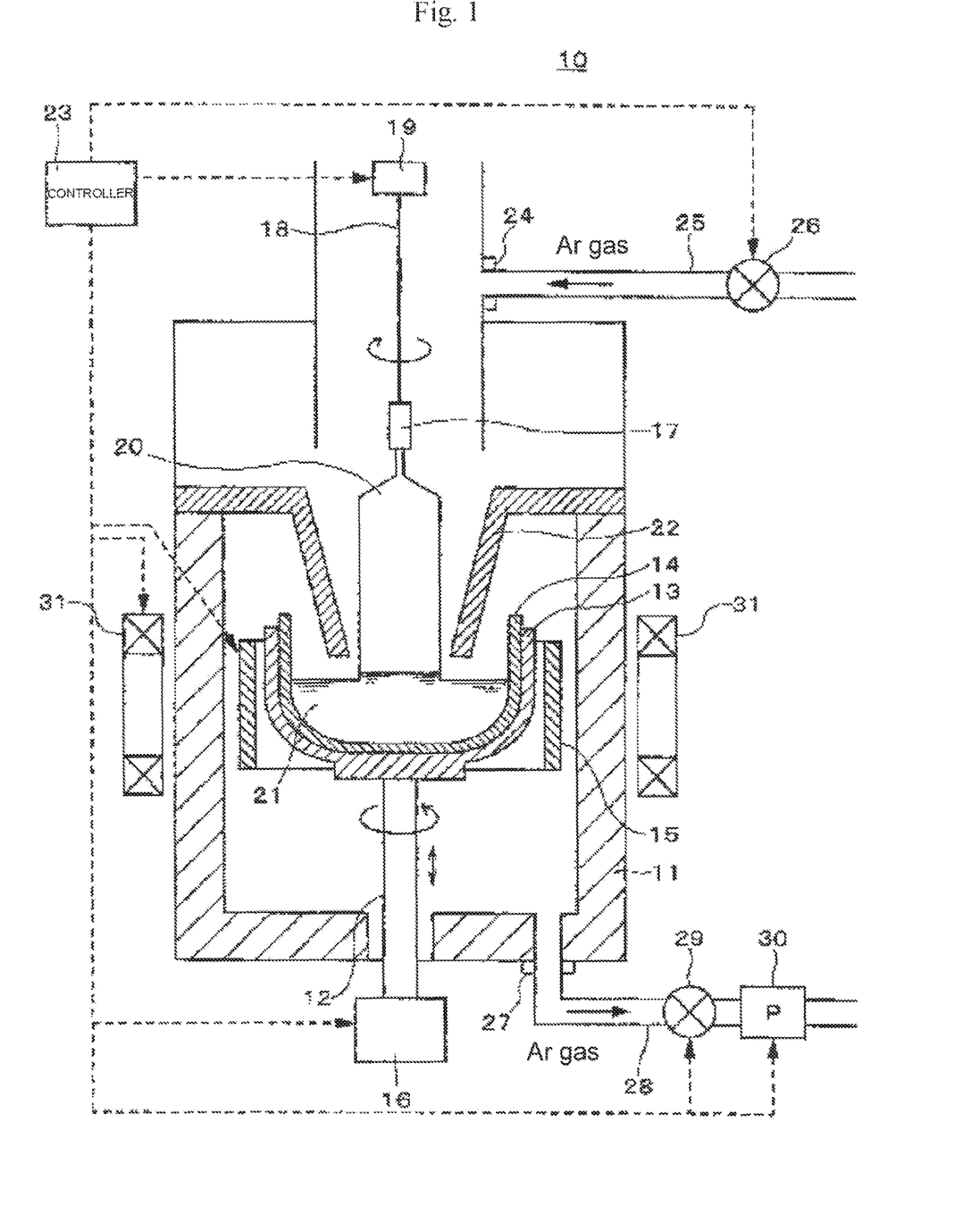
FIG. 1 is an explanatory view showing a configuration of a silicon single crystal pulling apparatus used in Examples.

A plurality of silicon single crystal ingots having different carbon concentrations was grown by modifying equal to or more than one manufacturing conditions selected from the group consisting of a grade of a raw material polysilicon, a pulling apparatus, growth conditions and a grade of a raw material polysilicon, through the use of the silicon single crystal pulling apparatus having the configuration shown in FIG. 1.

Hereinafter, details of the silicon single crystal pulling apparatus shown in FIG. 1 will be described.

A silicon single crystal pulling apparatus 10 shown in FIG. 1 includes a chamber 11, a supporting rotary shaft 12 vertically provided penetrating through a bottom center of the chamber 11, a graphite susceptor 13 fixed to an upper end part of the supporting rotary shaft 12, a quartz crucible 14 accommodated in the graphite susceptor 13, a heater 15 provided around the graphite susceptor 13, a supporting shaft-driving mechanism 16 for lifting/lowering and rotating the supporting rotary shaft 12, a seed chuck 17 for holding seed crystals, a pulling wire 18 for hanging the seed chuck 17, a wire-winding mechanism 19 for winding the pulling wire 18, a heat-shielding member 22 for preventing heating of a silicon single crystal ingot 20 by radiant heat from the heater 15 and the quartz crucible 14 and for suppressing temperature fluctuation of a silicon melt 21, and a controller 23 for controlling each unit.

A gas inlet 24 for introducing Ar gas into the chamber 11 is provided above the chamber 11. The Ar gas is introduced from the gas inlet 24 into the chamber 11 through a gas pipe 25, and a gas introduction amount is controlled by a conductance valve 26.

A gas outlet 27 for exhausting Ar gas in the chamber 11 is provided on the bottom part of the chamber 11. The Ar gas in the sealed chamber 11 is discharged from the gas outlet 27 to the outside via an exhaust gas pipe 28. A conductance valve 29 and a vacuum pump 30 are installed in the middle of the exhaust gas pipe 28, and a flow rate of the Ar gas is controlled by the conductance valve 29 while sucking the Ar gas in the chamber 11 by use of the vacuum pump 30, whereby the depressurized state in the chamber 11 is maintained.

Furthermore, a magnetic field supplier 31 for applying a magnetic field to the silicon melt 21 is provided outside the chamber 11. The magnetic field supplied from the magnetic field supplier 31 may be a horizontal magnetic field or a cusp magnetic field.

2. Cutting-Out of Silicon Sample

Each silicon single crystal ingot grown in the above was cut off, and two samples in a wafer shape (silicon wafer having a diameter of 200 mm) were cut out from a top part of one each silicon single crystal ingot. The two samples were used for measurement to be described later, one as a silicon sample for photoluminescence measurement and the other one as a silicon sample for SIMS measurement. The silicon single crystal ingot was made of an n-type silicon (resistivity: 10 Ω·cm to 100 Ω·cm).

3. Formation of Oxide Film

Silicon samples (silicon wafers) for photoluminescence measurement cut out from each of the above silicon single crystal ingots were arranged in a thermal oxidation furnace (oxygen 100 vol % atmosphere, in-furnace atmospheric temperature 1000° C.) for 10 minutes to thereby form an oxide film on the entire surface of the silicon wafers. A thickness of an oxide film formed on a main surface, onto which an electron beam was irradiated by the following treatment, was about 40 cm.

4. Particle Beam Irradiation

An electron beam was irradiated as a particle beam onto the entire surface of the oxide film surface formed by above 3 on one of main surfaces of each of the silicon samples (silicon wafers) for photoluminescence, measurement. Electron beam irradiation conditions were set to an acceleration voltage of 800 kV and an irradiation amount of 4.2E+15 electrons/cm$^2$. The silicon wafers after the electron beam irradiation were placed in a room temperature circumstance until photoluminescence measurement was performed.

5. Photoluminescence Measurement

Photoluminescence measurement was performed on each of the silicon samples for photoluminescence measurement after irradiation with a particle beam in the above 4. Treatments from excitation light irradiation to photoluminescence intensity measurement were performed by a room temperature PL method through the use of SiPHER manufactured by Nanometrics Inc. as a PL measurement apparatus. The PL measurement apparatus used here includes a light source that performs irradiation with visible laser light having a larger energy than a band gap of silicon as excitation light. Specifically, the excitation light was irradiated onto the surface of the oxide film, onto which a particle beam was irradiated in the above 4, and luminescence intensity map measurement was performed at 500 μm pitches on the main surface of the silicon wafer (more specifically, surface of the oxide film) onto which the excitation light was irradiated. The luminescence intensity was determined as an in-plane average value of luminescence intensity having a peak at a wavelength of 1150 nm (area integrated intensity of luminescence spectrum). Luminescence (photoluminescence) observed, in the above is band-edge luminescence of silicon.

6. Measurement by SIMS

A carbon concentration of each silicon sample for SIMS measurement cut out from each of the silicon single crystal ingots was determined by performing SIMS measurement (carbon concentration measurement by a raster variation method).

7. Creation of Calibration Curve

Figure 2:
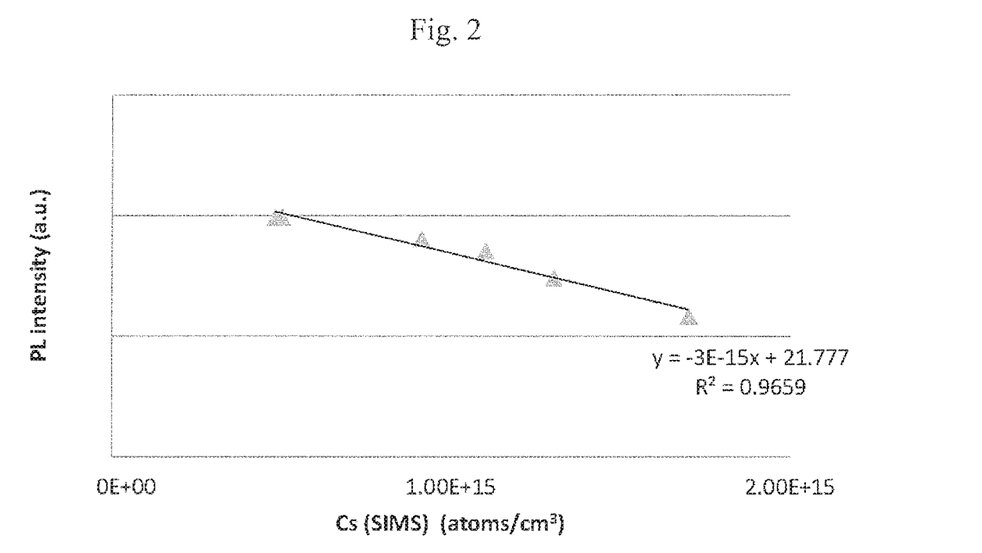
FIG. 2 shows a graph and calibration curve created in Example 1.
Figure 3:
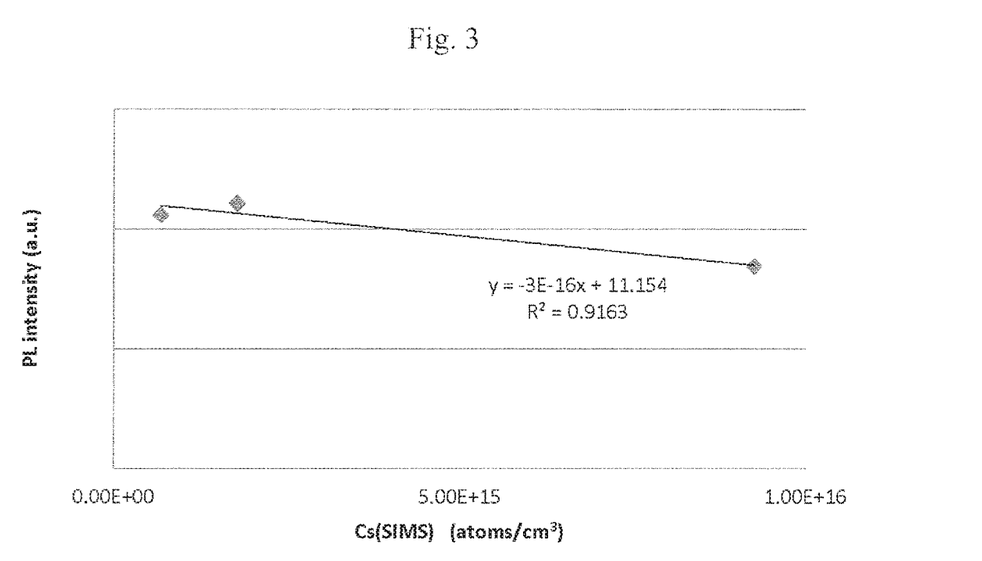
FIG. 3 shows a graph and calibration curve created in Example 2.
Figure 4:
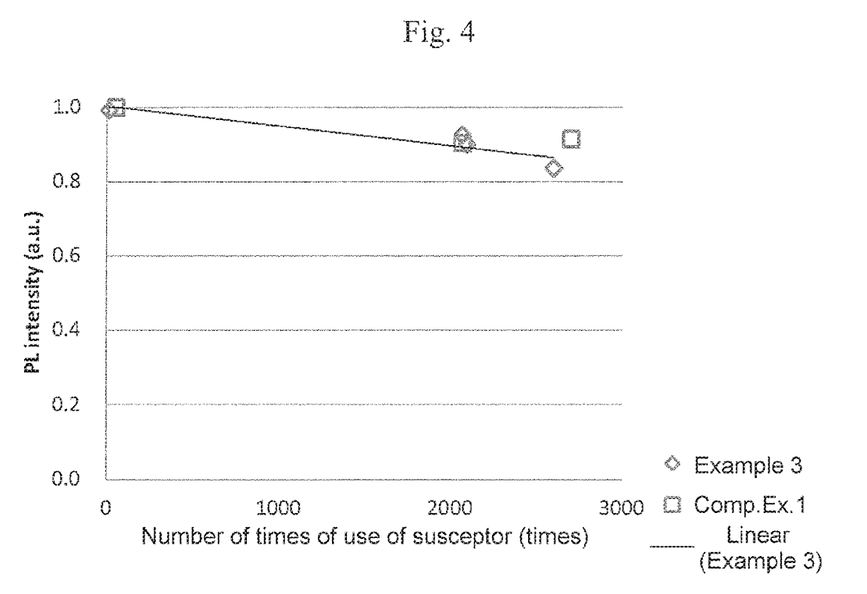
FIG. 4 shows evaluation results obtained in Example 3 and Comparative Example 1.

With a carbon concentration on a horizontal axis and a photoluminescence intensity on a vertical axis, a graph was created by using the carbon concentration determined by the SIMS measurement ire the above 6 and the photoluminescence intensity (intensity of band-edge luminescence of silicon) determined in the above 5 with respect to a silicon sample for photoluminescence measurement obtained from the same sample as the silicon sample for SIMS measurement, and then, the plot on the created graph was used to create a calibration curve by a fitting treatment (least-square method). The created graph and calibration curve are shown in FIG. 2. In FIG. 2, and FIGS. 3 and 4 to be described later, "a.u." means an arbitrary unit.

Example 2

In the same way as in Example 1 except that a p-type silicon (resistivity: 10 Ω·cm) was used as a silicon single crystal ingot, a photoluminescence intensity (intensity of band-edge luminescence of silicon) of a silicon sample (silicon wafer) for photoluminescence measurement and a carbon concentration of a silicon sample for SIMS measurement were determined. Through the use of the determined values, a graph and a calibration curve were created by the same method as in Example 1. The created graph and calibration curve are shown in FIG. 3.

With respect to Example 1, from the fact that $R^2$ being a square of a correlation coefficient of a linear function of a calibration curve shown in FIG. 2, exceeds 0.9 (see FIG. 2), it can be confirmed that the photoluminescence intensity (intensity of band-edge luminescence of silicon) determined in the above 5 has a good correlation (negative correlation) with the carbon concentration.

Also with respect to Example 2, since $R^2$, a square of a correlation coefficient of a linear function of a calibration curve shown in FIG. 3, exceeds 0.9 (see FIG. 3), it can be confirmed that the photoluminescence intensity (intensity of band-edge luminescence of silicon) has good correlation with the carbon concentration.

Through the use of the calibration curve thus created, the carbon concentration of the silicon sample can be measured with high accuracy.

In addition, from results obtained in Examples 1 and 2, it can also be confirmed that, according to the above method of evaluating carbon concentration, a carbon concentration of a silicon sample can be evaluated with sensitivity equal to or higher than sensitivity achievable by a SIMS method.

Example 3

A plurality of epitaxial wafers (substrate resistivity: 0.01 Ω·cm epitaxial layer resistivity: 25 Ω·cm, epitaxial layer thickness: 60 μm) produced by vapor-growing an epitaxial layer in an epitaxial growth furnace through the use of an n-type silicon substrate having a diameter of 200 mm, as prepared. Although each of the epitaxial wafers was produced by using the same epitaxial growth furnace, susceptors each having a different number of times of use (number of times of repeated use) were used as a susceptor for arranging a silicon substrate in the furnace. As a silicon substrate for producing each of the epitaxial a silicon wafer cut out from a position adjacent to the same silicon single crystal ingot was used.

Treatments described in 3 to 5 in Example 1 were performed on each of the epitaxial wafers, and luminescence intensity (intensity of band-edge luminescence of silicon) was determined as an in-plane average value. Particle beam irradiation and photoluminescence measurement were performed on the main surface on the epitaxial layer side of each of the epitaxial wafers.

Comparative Example 1

A plurality of epitaxial wafers (substrate resistivity: 0.01 Ω·cm, epitaxial layer resistivity: 25 Ω·cm, epitaxial layer thickness: 60 μm) produced by vapor-growing an epitaxial layer in an epitaxial growth furnace through the use of an n-type silicon substrate having a diameter of 200 mm, was prepared. Although each of the epitaxial wafers was produced in the same epitaxial growth furnace as the epitaxial growth furnace used for producing the epitaxial wafer, evaluated in Example 3, susceptors each having a different number of times of use were used as a susceptor for arranging a silicon substrate in the furnace.

In the same way as in Example 3 except that each of the epitaxial wafers was not irradiated with particle beam, luminescence intensity was determined as an in-plane average value.

FIG. 4 illustrates a graph created with the number of times of use of an susceptor on a horizontal axis and a photoluminescence intensity (intensity of band-edge luminescence of silicon) on a vertical axis, through the use of results obtained in Example 3 and Comparative Example 1 described above.

As can be confirmed by the graph shown in FIG. 4, a tendency can be confirmed from the evaluation results of Example 3 that larger number of times of use of a susceptor causes weaker photoluminescence intensity (intensity of band-edge luminescence of silicon). On the other hand, as confirmed in Examples 1 and 2, a negative correlation in which stronger intensity of band-edge luminescence of silicon gives lower carbon concentration is observed.

From the above results, it can be evaluated, that an epitaxial wafer produced by using a susceptor with larger number of times of use gives higher carbon concentration. Furthermore, from this result, it can be estimated that a susceptor made of SiC and repeatedly used deteriorates to thereby cause carbon contamination. In a manufacturing process of a silicon wafer, it becomes possible to reduce carbon contamination of a silicon wafer to be subsequently produced in the manufacturing process, by replacing such a deteriorated susceptor.

In contrast, in the evaluation result in Comparative Example 1 in which photoluminescence measurement was performed without particle beam irradiation, no correlation was observed between the number of times of use of a susceptor and photoluminescence intensity. For example, in a region where the number of times of use of a susceptor was equal to or more than 2000, different numbers of uses of a susceptor gave a similar value of photoluminescence intensity.

From the above comparison between Example 3 and Comparative Example 1, it can be confirmed that particle beam irradiation performed as a pretreatment of photoluminescence measurement causes an excellent correlation between intensity of band-edge luminescence of silicon and a carbon concentration which are to be subsequently measured.

An aspect of the present invention is useful in the field of manufacturing silicon wafers and silicon single crystal ingots.

The invention claimed is:
1. A method of evaluating a carbon concentration of a silicon sample, comprising:
   forming an oxide film on at least a part of a surface of an evaluation-target silicon sample;
   irradiating a particle beam onto a surface of the oxide film;
   irradiating an excitation light having an energy larger than a band gap of silicon onto the surface of the oxide film, onto which the particle beam has been irradiated;
   measuring an intensity of photoluminescence emitted from the evaluation-target silicon sample irradiated with the excitation light; and
   evaluating a carbon concentration of the evaluation-target silicon sample on a basis of the measured intensity of photoluminescence,
   wherein the photoluminescence is band-edge luminescence of silicon.
2. The method of evaluating a carbon concentration of a silicon sample according to claim 1, wherein the particle beam comprises an electron beam.
3. The method of evaluating a carbon concentration of a silicon sample according to claim 1, wherein a resistivity of the evaluation-target silicon sample is equal to or higher than 1 Ω·cm.
4. The method of evaluating a carbon concentration of a silicon sample according to claim 1, wherein measuring the intensity of photoluminescence comprises determining the intensity of photoluminescence as an intensity of band-edge luminescence at room temperature emitted from the evaluation-target silicon sample irradiated with the excitation light.
5. The method of evaluating a carbon concentration of a silicon sample according to claim 4, wherein the intensity of band-edge luminescence at room temperature comprises an intensity of luminescence having a peak at a wavelength of 1150 nm.
6. The method of evaluating a carbon concentration of a silicon sample according to claim 1, further comprising determining the carbon concentration of the evaluation-target silicon sample by using a calibration curve on a basis of the intensity of photoluminescence.
7. The method of evaluating a carbon concentration of a silicon sample according to claim 6, further comprising:
   creating the calibration curve by using: the intensity of band-edge luminescence of silicon obtained by performing (1) to (4) below on each silicon sample of a plurality of silicon samples for creating the calibration curve, each silicon sample having a known carbon concentration; and the known carbon concentration:
   (1) forming an oxide film on at least a part of a surface of a silicon sample for creating the calibration curve, the silicon sample having a known carbon concentration;
   (2) irradiating a particle beam onto a surface of the oxide film;
   (3) irradiating an excitation light having an energy larger than a band gap of silicon onto the surface of the oxide film, onto which the particle beam has been irradiated; and
   (4) measuring an intensity of band-edge photoluminescence of silicon emitted from the silicon sample for creating the calibration curve and irradiated with the excitation light.
8. The method of evaluating a carbon concentration of a silicon sample according to claim 7, further comprising determining the known carbon concentration by a SIMS method.
9. The method of evaluating a carbon concentration of a silicon sample according to claim 1, further comprising:
   placing the evaluation-target silicon sample at an atmospheric temperature equal to or lower than 100° C. in an environment during a period from irradiating the particle beam onto the surface of the oxide film until measuring the intensity of photoluminescence.
10. The method of evaluating a carbon concentration of a silicon sample according to claim 1, wherein the evaluation-target silicon sample comprises a silicon wafer.
11. A method of evaluating a silicon wafer manufacturing process, comprising:
   evaluating a carbon concentration of a silicon wafer manufactured in an evaluation-target silicon wafer manufacturing process by the method according to claim 10 to obtain an evaluation result; and
   evaluating a level of the carbon contamination in the evaluation-target silicon wafer manufacturing process on a basis of the evaluation result.

12. A method of manufacturing a silicon wafer, comprising:
   evaluating a silicon wafer manufacturing process by the method of evaluating according to claim 11; and
   manufacturing a silicon wafer, either in a silicon wafer manufacturing process in which a level of a carbon contamination has been determined, as a result of the evaluating, to be an allowable level, or in a silicon wafer manufacturing process after subjecting the silicon wafer manufacturing process in which a level of a carbon contamination has been determined, as a result of the evaluating, to exceed an allowable level, to a carbon contamination reduction treatment.

13. A method of manufacturing a silicon single crystal ingot, comprising:
   growing a silicon single crystal ingot by Czochralski method;
   evaluating a carbon concentration of a silicon sample cut out from the silicon single crystal ingot by the method according to claim 1 to obtain an evaluation result;
   determining a silicon single crystal ingot manufacturing condition on a basis of the evaluation result; and
   growing a silicon single crystal ingot by Czochralski method under the determined silicon single crystal ingot manufacturing condition.

\* \* \* \* \*